United States Patent [19]

Friedman et al.

[11] Patent Number: 5,240,866

[45] Date of Patent: Aug. 31, 1993

[54] METHOD FOR CHARACTERIZING FAILED CIRCUITS ON SEMICONDUCTOR WAFERS

[75] Inventors: J. David Friedman, Berkeley Heights, N.J.; Mark H. Hansen, Oakland, Calif.; James R. Hoyer, Orlando, Fla.; Vijayan N. Nair, Murray Hill, N.J.

[73] Assignee: AT&T Bell Laboratories, Murray Hill, N.J.

[21] Appl. No.: 829,634

[22] Filed: Feb. 3, 1992

[51] Int. Cl.⁵ .............................................. H01L 21/66
[52] U.S. Cl. ..................................................... 437/8
[58] Field of Search .......................... 437/8; 364/158 R

[56] References Cited

U.S. PATENT DOCUMENTS 4,855,253  8/1989  Weber ..................................... 437/8

OTHER PUBLICATIONS

W. Taam and M. Hamada, "Detecting Spatial Effects from Factorial Experiments: An Application in Integrated-Circuit Manufacturing," *IIQP Research Report* RR-90-02, 23 pp., Apr. 1990, University of Waterloo, Waterloo, Ontario, Canada.

P. A. P. Moran, "The Interpretation of Statistica. Maps," Journal of Royal Statistical Society, Series B, vol. 10, pp. 243-251 (1948).

P. V. Krishna Iyer, "The Theory of Probability Distributions of Points on a Lattice," Annals of Mathematical Statistics, vol. 21, pp. 198-217 (1950), Univ. of Oxford.

*Primary Examiner*—Tom Thomas
*Attorney, Agent, or Firm*—Robert B. Levy

[57] ABSTRACT

Failed circuits (e.g., defects) on each of a plurality of semiconductor wafers (10) in a batch can be characterized for the purpose of identifying defect sources by first mapping the defective ones of the circuits ($12_1$–$12_n$) in each wafer. A determination is made to see if the defects in the defect pattern map associated with each wafer (10) are sufficiently clustered to warrant further study. The defect pattern maps for the wafers in the batch identified as having spatial clustering present are smoothed and thresholded to identify where spatial clusters occur. All such smoothed and thresholded defect pattern maps are separated into groups in accordance with the pattern of defects. The pattern of defects associated with each group is then analyzed to determine if any relationship exists between the pattern and the order of the process steps or one of the patterns in a library of patterns associated with particular failure modes. Should a match be found, then the particular process step(s) or failure mode(s) responsible for such defects can be indicted.

5 Claims, 4 Drawing Sheets

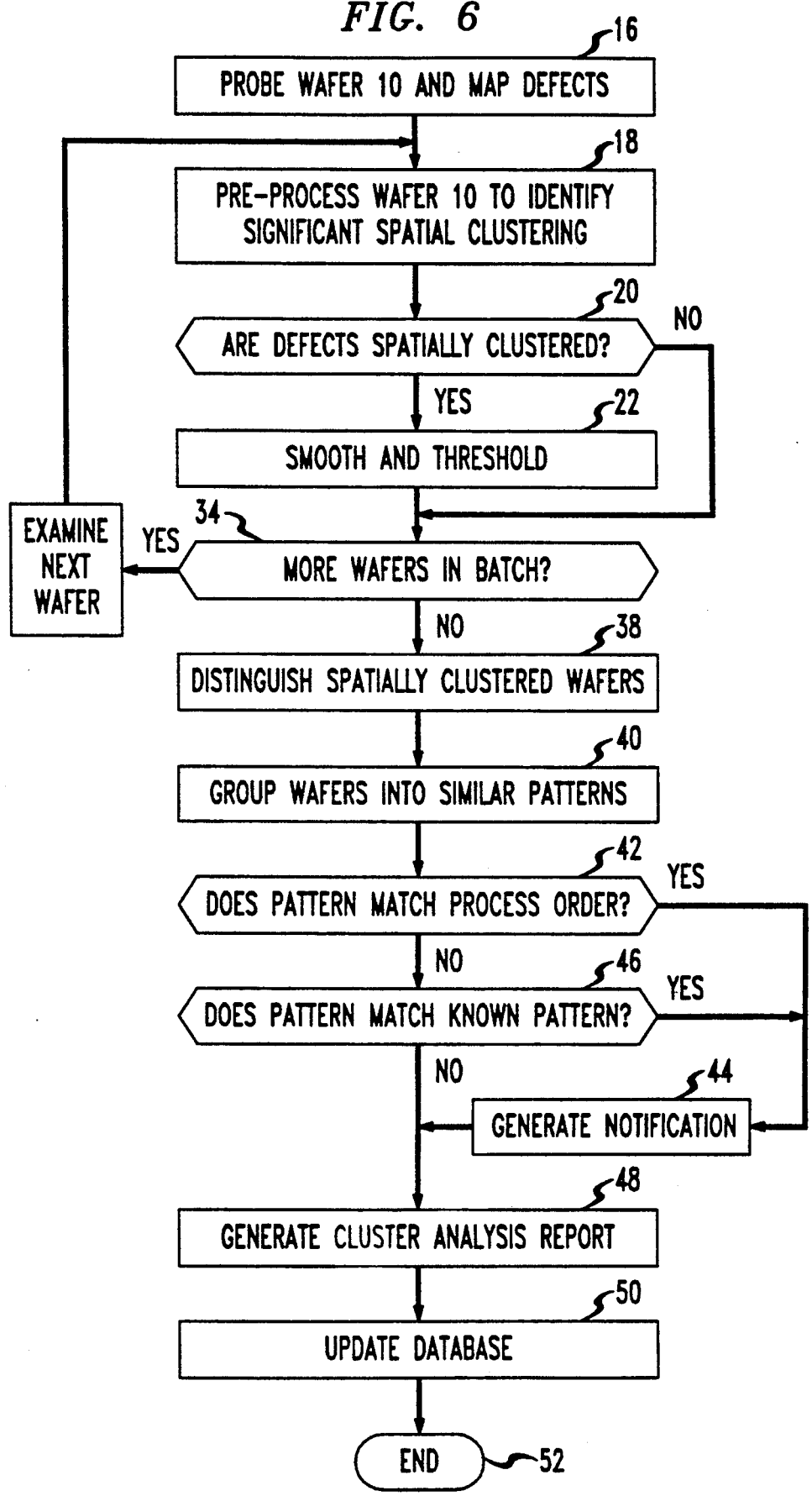

METHOD FOR CHARACTERIZING FAILED CIRCUITS ON SEMICONDUCTOR WAFERS

TECHNICAL FIELD

This invention relates to a technique for characterizing the sources of failed circuits (defects) on semiconductor wafers to identify which process step(s)/failure mode(s), if any, caused the defects.

BACKGROUND OF THE INVENTION

The most common technique for manufacturing integrated circuits today is the planer technology method whereby individual circuits are formed below the surface of a semiconductor substrate (i.e., a wafer). The planer technology method is conventionally practiced by first fabricating an ingot of substantially pure semiconductor material which is then sliced to yield individual wafers. Next, at least one layer of semiconductor material of a different type is formed (i.e., epitaxially grown) on the upper surface of each wafer. Thereafter, the surface of the upper epitaxial layer on each wafer is passivated, and then is selectively etched by photolithographic techniques to create openings in which semiconductor junctions are formed. After formation of the semiconductor junctions, interconnections between the junctions in each wafer are formed by depositing a metal such as aluminum.

Once the individual circuits are formed on each wafer, the circuits are tested by probing using a conventional probe designed for that purpose. Those circuits which are found to be defective during probing are recorded as to their location on the wafer. Following probing, each wafer is then diced into circuit-containing chips, the defect-free ones of which are thereafter each separately packaged to yield individual integrated circuits.

As may be appreciated, the manufacture of integrated circuits by the above-described method is complex and involves many different process steps. Failure to execute one or more process steps correctly on one or more wafers in a batch will likely cause one or more circuits on each wafer to fail, such circuit failures being referred to as defects. Further, random defects (circuit failures) can and do occur. Usually, there is little that can be done to avoid random defects. Often, however, defects are spatially clustered as a result of one or more process steps being improperly executed. A knowledge of which of the process steps was not properly executed can lead to improved performance through process modification.

Presently, there are no known automated techniques which use data on failed circuits and their spatial location on a semiconductor wafer to identify the process steps and/or failure modes (if any) to which such defects are attributable. Rather, defect characterization is typically accomplished by failure mode analysis, which is time consuming and expensive (such failure mode analysis of a single lot can take up to three days).

Therefore, there is need for an automated technique which can characterize sources of defects on a semiconductor wafer.

SUMMARY OF THE INVENTION

Briefly, in accordance with the invention, a technique is disclosed for characterizing the sources of defects (i.e., failed circuits) associated with a batch of semiconductor wafers. The technique of the invention uses data obtained by first locating (i.e., mapping) the failed circuits associated with each wafer, such defect mapping being carried out by probing each wafer using conventional probing techniques to ascertain which of the circuits therein is defective (i.e., a "defect"). Once the defects have been mapped, the method of the invention is initiated by determining, for each wafer, whether the failed circuits exhibit significant clustering. This is done by using a statistical test procedure. Wafers which exhibit significant clustering contravene the usual assumption that defects are random. If spatial clustering is found, the wafers are processed to identify spatially clustered circuits. In practice, identification of spatially clustered circuits is done using the following steps. First, a weighted average of the number of defects (failed circuits) surrounding each individual circuit on each wafer is established. The weighted averages are then transformed. Should the transformed values exceed a preset limit, then the circuit is considered to be part of a spatial cluster.

Those wafers found to have spatially clustered defects are then separated into groups in accordance with the cluster patterns. An analysis is then made of the cluster pattern associated with the wafers in each group and of the process steps undergone by the wafers in that group to determine if a relationship exists therebetween. (All of the wafers in a given batch typically undergo the same process steps, but are not necessarily processed in the same order.) If such a relationship is found to exist, then the process step or steps which likely gave rise to the particular cluster pattern of defects can be identified. Patterns within each group are also compared to mappings generated from known defect sources to identify similarities in patterns of failure.

BRIEF DESCRIPTION OF THE DRAWING

FIG. 6 is a flowchart diagram of a technique, in accordance with the present invention, for characterizing the defects depicted in FIGS. 3-6;

DETAILED DESCRIPTION

Figure 1:
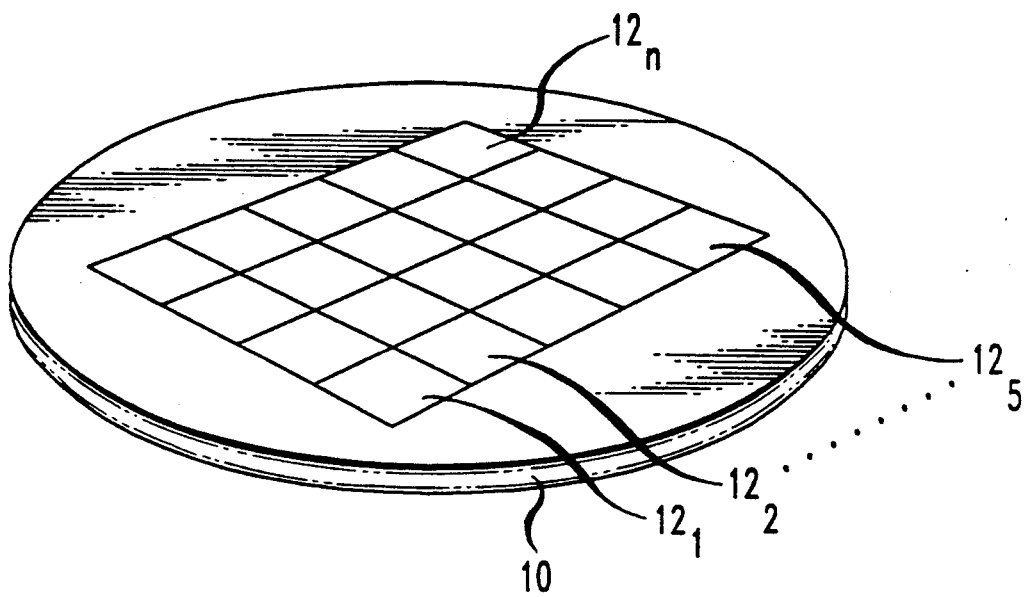
FIG. 1 is a front view, in perspective, of a prior art semiconductor wafer.

FIG. 1 is a top view, in perspective, of a semiconductor wafer 10, in accordance with the prior art, which has been processed to create a plurality of individual circuits, $12_1, 12_2, 12_3 \ldots 12_n$ therein (where n is an integer). Typically, although not necessarily, the circuits $12_1$–$12_n$ are fabricated in the wafer 10 by the well-known planer technology process. The planer technology process is practiced by first obtaining individual wafers 10 from an ingot (not shown) of substantially pure semiconductor material. Thereafter, at least one layer (not shown) of a different type of semiconductor material is epitaxially grown on the upper surface of each wafer 10. The uppermost epitaxially grown layer on each wafer 10 is passivated and then etched. Following etching, interconnections between the passivated regions, exposed after etching, are established to create the circuits $12_1-12_n$ on each wafer 10.

In practice, those wafers 10 which are to yield a particular type or code of circuits $12_1-12_n$ are processed in a batch of approximately fifty wafers. Each wafer 10 in the batch is subjected to the same set of process operations as the others. While the wafers 10 in a given batch are subjected to the same processing operations, the original order of the wafers in the batch is usually not maintained between processing steps. For example, the first wafer in the batch during etching may not be first in the batch during passivation.

Figure 2:
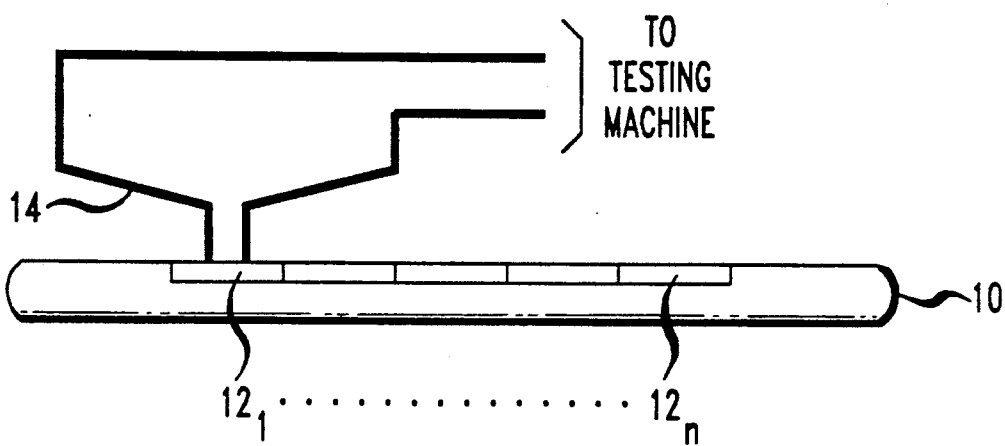
FIG. 2 is a side view of the wafer of FIG. 1 showing how the wafer is tested (probed) using conventional wafer probes.
Figure 3:
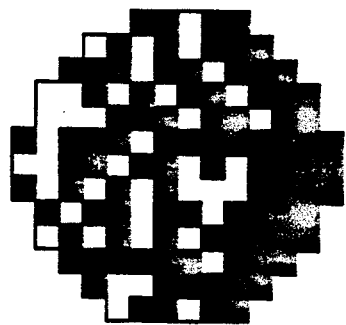
FIGS. 3, 4 and 5 each represent a pattern of defects on a wafer of the type illustrated in FIG. 1, where white squares represent functioning (defect-free) circuits and black squares represent failed circuits (defects)
Figure 4:
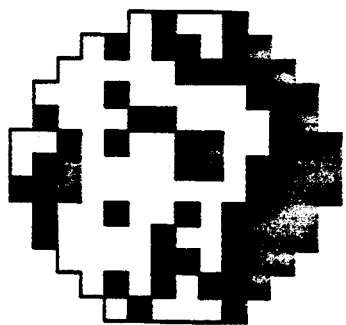
Figure 5:
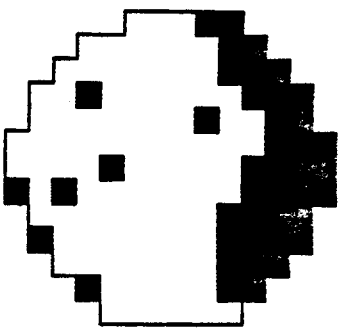

Referring to FIG. 2, after fabrication of the circuits $12_1-12_n$ in each wafer 10, each wafer in the batch is typically probed by two or more probes 14 which are displaced to make contact with each circuit. The probes 14 are connected to a testing machine (not shown) of a type well-known in the art which serves to inject signals into each of the circuits $12_1-12_n$ and to recover signals therefrom in order to test their operability. It is not unusual for one or more of the circuits $12_1-12_n$ to be found defective (i.e., to fail testing). For ease of discussion, a failed one of the circuits $12_1-12_n$ will hereinafter be referred to simply as a "defect." Following probing of each wafer 10, the total number and location of the defects are established. Each of FIGS. 3-5 depicts a map of the pattern of defects associated with a separate one of three wafers 10.

Defects can and do occur randomly. Often, however, defects occur as a result of one or more process steps being improperly executed. For example, a defect may be attributable to an oxide growth that resulted in the oxide being too thick. Since this was most likely caused by uneven heating in a diffusion step, a large number of contiguous circuits will fail for the same reason, causing a spatial cluster of failed circuits. A knowledge of which process step has been improperly performed is critical if improving yields are to be obtained (the yield being defined as the percentage of non-defective circuits formed in each wafer 10). However, at present, there is no known automated technique which can characterize the defects in a semiconductor wafer 10 in order to facilitate a determination of which, if any, process steps and/or failure modes is responsible for a given pattern of defects.

Referring now to FIG. 6, there is shown, in flowchart form, a method in accordance with the invention for characterizing the defects, that is, the failed ones of the circuits $12_1-12_n$, in a batch of wafers 10, to determine which process step(s) or failure mode(s) gave rise to a particular pattern of defects.

The technique of the invention makes use of the data of circuit failures obtained by probing each wafer in a batch and mapping the defects (step 16) in the manner previously discussed with respect to FIG. 2. After a defect pattern map has been generated for each wafer 10 so as to contain the defects (i.e., failed circuits) associated therewith, then the technique of the invention may itself be initiated. First, the pattern map associated with each wafer 10 is processed to determine if the defects exhibit significant clustering (step 20). Such clustering is determined by examining a specified neighborhood surrounding each defect-free circuit $12_i$ (where $i \leq n$) to determine the proportion of defect-free circuits in such a neighborhood. For purposes of discussion, the term GG is assigned to represent this value. This is done for all the defect-free circuits and the resulting proportions are summed.

For each circuit $12_i$ which is defective, the proportion of other defective circuits surrounding it within a specified neighborhood is likewise calculated and the resulting proportions are summed. For purposes of discussion, the term BB is assigned to represent this value. The manner in which both BB and GG are calculated is similar to calculations described in the works of P. A. P. Moran, "The Interpretation of Statistical Maps", *Journal of Royal Statistical Society, Series B*, Vol. 10, pages 243-251 (1948); A. D. Cliff et al., *Spatial Process Models and Applications*, London:Pion (1981).

Following computation of both BB and GG, which are known as join-count statistics, these two values are measured against a probability distribution for BB and GG for an average wafer having no spatial clustering. If the computed values of BB and GG are well outside a critical value derived from the probability distribution, then the defects are deemed to be significantly spatially clustered and step 22 is then executed.

Figure 8:
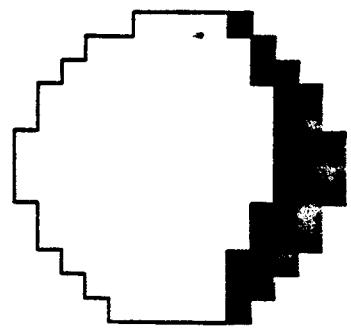
FIGS. 8, 9 and 10, each represent a corresponding one of the patterns of FIGS. 3, 4 and 5, respectively, after smoothing.
Figure 9:
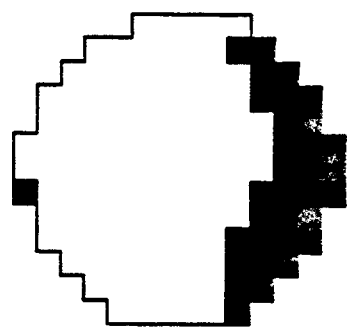
Figure 10:
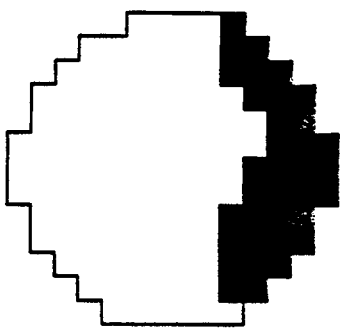
Figure 7:
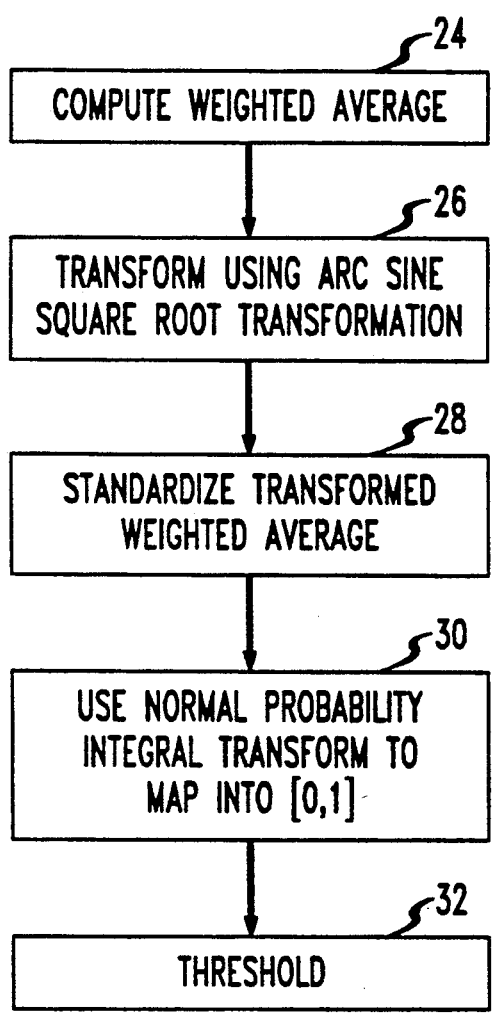
FIG. 7 is a flowchart diagram of a sub-process, executed in connection with the technique of FIG. 6, for smoothing and thresholding the wafer defect pattern.

During step 22, the wafer pattern defect map associated with each wafer 10 whose defects are deemed to be significantly clustered is then processed to eliminate random defects. Typically, such processing is carried out by "smoothing and thresholding" each pattern map by a process best illustrated in FIG. 7. Referring to FIG. 7, the first step (step 24) in the smoothing and thresholding process is computing the weighted number of defects occurring in the neighborhood of each circuit $12_i$. Next, the weighted average is transformed by applying an arc-sine square-root transformation (step 26). The transformed value is then standardized (step 28) by subtracting off its expected value and dividing by its standard deviation, where the expected value and standard deviation are computed under the null hypothesis that the defects are not clustered. The standardized value is then mapped into [0,1] using a normal probability integral transformation (step 30). Finally, the mapped value is compared to a prescribed threshold value to obtain a binary classification, such that if the mapped value exceeds the threshold value, the circuit is assigned a binary one; otherwise, it is assigned a zero (step 32). This process is carried out for each of the circuits $12_1-12_n$ in the wafer 10. The resulting pattern maps of the circuits for each of three exemplary wafers 10, with the binary 1's and 0's represented by the white and black areas, respectively, are shown in FIGS. 8-10. Such pattern maps are used as the input for subsequent processing, as will be described below.

Referring to FIG. 6, following step 22, (or following step 20 if the defects are found not be clustered), a check is then made during step 34 to determine if there are further wafers left in the batch which have yet to be examined. If so, then step 36 is executed, and the next wafer 10 in the batch is examined. Thereafter step 18 is re-executed.

Once all of the wafers 10 have been examined, then those which were found to have significantly clustered defects are distinguished from those not having clustered defects (step 38). Next, the binary 0-1 pattern maps associated with the wafers 10 having significantly clustered defects are grouped into homogeneous patterns (step 40). Such grouping is accomplished by a well-known hierarchical clustering technique. To employ this technique, a distance must be computed between each pair of wafers in the batch. In accordance with the invention, the distance is computed by comparing each circuit $12_i$ in one wafer 10 of a pair to the corresponding circuit in the other wafer. If the binary value associated with each circuit matches the other in the pair (i.e., both circuits are good or both are bad), the distance between the circuits is deemed to be zero; otherwise the value is one. The comparison is done for all of the circuits $12_1$–$12_n$ on each pair and the distances accumulated. This measure is used to establish the grouping of the wafer defect patterns.

Once the wafer defect patterns are grouped, then a determination is made whether or not those wafers whose defect patterns lie in a particular group share some commonality in the manner or sequence in which they were processed (step 42). Examples of wafers with processing commonality include: wafers processed simultaneously in a batch operation (i.e. immersion in a solution bath); wafers which are processed contiguously in a serial (single wafer setting) operation and those wafers exposed to similar parts of a processing machine (i.e., the same end of a furnace or to the same electrode of a ion etcher). In practice, each wafer 10 of FIG. 1 is uniquely marked with a machine-readable code (not shown), such as the bar code described in U.S. Pat. No. 4,585,931, issued on Apr. 29, 1986, and assigned to AT&T Technologies Inc. The code on each wafer 10 allows for automated recording of the exact location of each wafer in the batch as the batch progresses through each step of the manufacturing process.

If, during step 42, there is a match between the pattern of a particular group of wafers 10 and the commonality shared by the wafers in that group, then a notification of such a match is generated (step 44). Otherwise, step 46 is executed, whereupon a determination is made whether the [0-1] pattern map associated with each wafer matches a pattern from a set of stored pattern maps having known causes of failures. In practicing the technique of the invention, a library of such pattern maps is maintained and is used for comparison purposes during step 46. Should a match be found during step 46, then program execution branches to step 44, at which time, a notification would be generated identifying the particular failure mode.

After a notification has been generated during step 44, or alternatively, when no match is found during step 46, then a cluster analysis report is generated (step 48), the report containing information as to the types of defect patterns which are present, and the number of wafers exhibiting each pattern type. Following generation of the cluster analysis report, step 50 is executed and the master data base containing information about the wafers 10 in each lot is updated. Following step 50, the process ends (step 52).

The foregoing describes a process for characterizing the defects (failed circuits) on a semiconductor wafer 10 in order to establish which, if any, process steps and/or failure modes gave rise to such defects. The process may be carried out automatically, as the process steps can be readily executed with the aid of a well-known computer. Moreover, the process can be executed on an interactive basis by a process engineer.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for characterizing mapped defects associated with a plurality of semiconductor wafers which have each been subjected to a plurality of separate process operations to create a plurality of circuits in each wafer, comprising the steps of:
   determining if the mapped defects associated with each wafer are spatially clustered in separate patterns, and if so, then classifying those wafers having spatially clustered defects into groups in accordance with the manner in which the defect clusters are patterned;
   determining if a relationship exists between the defects associated with the wafers in each group and the process operations performed on the wafers in such group; and if such a relationship exists, then identifying which process operations gave rise to the defects associated with the wafers in each group.

2. The method according to claim 1 wherein the step of determining if the defects associated with each wafer are sufficiently clustered comprises the steps of:
   calculating join-count statistics of the proportion of defects surrounding each defective circuit and the proportion of defect-free circuits surrounding each defect-free circuit and comparing the statistics to a predetermined limit to determine whether significant spatial clustering exists;
   processing the wafer maps containing significant spatial clustering to expose spatially clustered elements.

3. The method according to claim 2 wherein the step of processing the mapped defects comprises the steps of:
   computing a weighted average of the defects surrounding each circuit on each wafer; using an arc-sine square-root transformation on the weighted averages; standardizing the transformed, weighted averages; and thresholding the standardized and transformed weighted averages.

4. The method according to claim 1 wherein mapped defects are obtained by electrically probing each of the circuits on each wafer to determine which are operative and which are defective.

5. The method according to claim 1 wherein classification of the wafers into groups in accordance with their pattern of clustering is accomplished by calculating the distance between each pair of wafers and using hierarchical clustering techniques on the resulting distance matrix.

* * * * *